United States Patent
Avellan et al.

(10) Patent No.: US 7,531,406 B2
(45) Date of Patent: May 12, 2009

(54) METHOD FOR FABRICATING AN ELECTRICAL COMPONENT

(75) Inventors: Alejandro Avellan, Dresden (DE); Thomas Hecht, Dresden (DE); Stefan Jakschik, Kessel-Lo (BE); Uwe Schroeder, Dresden (DE)

(73) Assignee: Infineon Technologies AG, Munich (DE)

( * ) Notice: Subject to any disclaimer, the term of this patent is extended or adjusted under 35 U.S.C. 154(b) by 328 days.

(21) Appl. No.: 11/399,811

(22) Filed: Apr. 7, 2006

(65) Prior Publication Data

US 2006/0234463 A1 Oct. 19, 2006

(30) Foreign Application Priority Data

Apr. 14, 2005 (DE) .................. 10 2005 018 029

(51) Int. Cl.
*H01L 21/8234* (2006.01)

(52) U.S. Cl. .................. 438/238; 438/239; 438/243; 438/745; 438/785; 257/E21.267; 257/E21.272

(58) Field of Classification Search .................. None
See application file for complete search history.

(56) References Cited

U.S. PATENT DOCUMENTS

| | | | |
|---|---|---|---|
| 6,309,775 B1 * | 10/2001 | Mank .................. 429/122 |
| 6,310,373 B1 * | 10/2001 | Azuma et al. .................. 287/295 |
| 6,323,512 B1 | 11/2001 | Noh et al. |
| 6,339,238 B1 | 1/2002 | Lim et al. |
| 6,399,521 B1 * | 6/2002 | Zhang et al. .................. 438/785 |
| 6,437,392 B1 | 8/2002 | Schneemeyer et al. |
| 6,812,101 B2 | 11/2004 | Moriwaki et al. |
| 6,867,452 B2 | 3/2005 | Hayashi et al. |
| 2002/0025453 A1 | 2/2002 | Tatsumi |
| 2002/0190294 A1 * | 12/2002 | Iizuka et al. .................. 257/296 |
| 2003/0173586 A1 | 9/2003 | Moriwaki et al. |
| 2003/0216028 A1 * | 11/2003 | Yoon .................. 438/627 |
| 2003/0222296 A1 * | 12/2003 | Kumar et al. .................. 257/301 |
| 2004/0266217 A1 * | 12/2004 | Kim et al. .................. 438/778 |
| 2005/0070126 A1 | 3/2005 | Senzaki |

FOREIGN PATENT DOCUMENTS

| | | |
|---|---|---|
| DE | 102 26 381 A1 | 1/2003 |
| EP | 1 300 887 A1 | 4/2003 |
| KR | 2001-0062199 | 7/2001 |
| TW | 485536 | 5/2002 |
| TW | 223819 B | 11/2004 |
| WO | WO 00/77832 A2 | 12/2000 |

OTHER PUBLICATIONS

Chen, F., et al., "A study of mixtures of $HfO_2$ and $TiO_2$ as high-k gate dielectrics," Microelectronic Engineering 72 (2004) pp. 263-266.

* cited by examiner

*Primary Examiner*—N Drew Richards
*Assistant Examiner*—Kyoung Lee
(74) *Attorney, Agent, or Firm*—Slater & Matsil, L.L.P.

(57) ABSTRACT

An electrical component, such as a DRAM semiconductor memory or a field-effect transistor is fabricated. At least one capacitor having a dielectric (130) and at least one connection electrode (120, 140) are fabricated. To enable the capacitors fabricated to have optimum storage properties even for very small capacitor structures, the dielectric (130) or the connection electrode (120, 140) are formed in such a manner that transient polarization effects are prevented or at least reduced.

32 Claims, 2 Drawing Sheets

METHOD FOR FABRICATING AN ELECTRICAL COMPONENT

This application claims priority to German Patent Application 10 2005 018 029.9, which was filed Apr. 14, 2005, and is incorporated herein by reference.

TECHNICAL FIELD

The invention relates to a method for fabricating an electrical component, for example, a DRAM semiconductor memory or a field-effect transistor, in which at least one capacitor having a dielectric and at least one connection electrode is fabricated.

BACKGROUND

A method of this type is known to be used in the semiconductor industry, for example to fabricate data memories or microprocessors. In the case of data memories, the information items to be stored in the memory cells of the data memories are in each case stored in the form of electric charges in the capacitors. In the case of field-effect transistors, by way of example, the gate dielectric and the gate connection electrode of the field-effect transistor form a capacitor structure.

SUMMARY OF THE INVENTION

In one aspect, the invention provides a method for fabricating an electrical component having at least one capacitor, in which the capacitors that are fabricated have optimum storage properties, in particular for the storage of data or for transistor applications, even with very small capacitor structures.

According to a first embodiment of the invention, a method is provided for fabricating an electrical component, in particular a DRAM semiconductor memory or a field-effect transistor, in which at least one capacitor having a dielectric and at least one connection electrode is fabricated. The dielectric or the connection electrode is formed in such a manner that transient polarization effects are prevented or at least reduced.

According to embodiments of the invention, therefore, it is provided that during the fabrication of the capacitor, the dielectric or the connection electrodes are formed in such a manner that transient polarization effects in the dielectric are prevented or at least reduced.

One major benefit of the method according to various embodiments of the invention is that on account of the reduction in the transient polarization effects, storage properties that are substantially independent of the prior history or previous operation of the capacitor are achieved even with very small capacitor structures. Transient polarization effects, which are attributable to a transient polarization behavior of the dielectric or are caused by protons within the dielectric, play a very major role in particular in the case of very small capacitor structures. These transient polarization effects lead to the capacitor having a storage behavior that is dependent on the previous history or prior operation of the capacitor. This means that the storage behavior of a logic "1" is dependent, for example, on whether a logic "1" or a logic "0" had previously been stored. Therefore, forming the dielectric and/or the connection electrode in accordance with embodiments of the invention has the effect of ensuring that the storage behavior of the resulting capacitor is substantially independent of how it had previously been operated. Moreover, charge losses caused by transient polarization effects are reduced, and consequently the retention time that can be achieved is significantly lengthened.

With a view to a targeted reduction of transient polarization effects within the dielectric, a particularly preferred, advantageous configuration of the method uses a material with which an equal distribution of potential wells, in particular an equal distribution of double potential wells, within the dielectric is disrupted, or at least reduced, as dielectric. This is because it has been established that transient polarization effects within the dielectric are dependent to a considerable extent on an equal distribution of the potential wells. If the equal distribution of the potential wells is now influenced and disrupted in a targeted way, it is possible to reduce or even completely avoid transient polarization effects within the dielectric.

With a view to avoiding transient polarization effects caused by protons included in the dielectric, it is regarded as advantageous for a material that acts as getter for protons that are present in the dielectric to be selected for the connection electrodes. This is because it has been discovered that when a dielectric is produced with the aid of methods that are currently customary in semiconductor technology, hydrogen and therefore protons are regularly incorporated in the dielectric and have a considerable influence on the storage behavior of the finished capacitors, in particular in the case of very small capacitor structures. The negative influence of the protons within the dielectric is considerably reduced by selecting a material that acts as a getter for protons for the connection electrodes, and the storage behavior of the resulting capacitors is greatly improved as a result. Inter alia, the retention time of the capacitors is also considerably increased.

It is preferable for a ternary, quaternary or higher material system comprising at least the following constituents: at least one oxide or nitride of a metal from the fourth transition group of the periodic system or at least one conductive oxide; at least one element from the third or fourth main group or the fifth transition group of the periodic system, to be used as dielectric.

By way of example, an Hf—Ti oxide or Hf—Ti nitride with an admixture of aluminum or silicon can be used as dielectric. By way of example an $Hf_xAl_yTi_z$ oxide, an $Hf_xAl_yTi_z$ nitride, an $Hf_xSi_yTi_z$ oxide or an $Hf_xSi_yTi_z$ nitride is preferably suitable for use as dielectric.

The dielectric used may also be a Zr—Ti oxide or a Zr—Ti nitride with an admixture of aluminum or silicon. By way of example, a $Zr_xAl_yTi_z$ oxide, a $Zr_xAl_yTi_z$ nitride, a $Zr_xSi_yTi_z$ oxide or a $Zr_xSi_yTi_z$ nitride is preferably suitable for use as dielectric.

Alternatively, the dielectric used may also be an Hf—Ta oxide or Hf—Ta nitride with an admixture of aluminum or silicon. By way of example, it is possible to use an $Hf_xAl_yTa_z$ oxide, an $Hf_xAl_yTa_z$ nitride, an $Hf_xSi_yTa_z$ oxide or an $Hf_xSi_yTa_z$ nitride.

Furthermore, it is also possible for the dielectric used to be a Zr—Ta oxide or Zr—Ta nitride with an admixture of aluminum or silicon. By way of example, it is possible to use a $Zr_xAl_yTa_z$ oxide, a $Zr_xAl_yTa_z$ nitride, a $Zr_xSi_yTa_z$ oxide or a $Zr_xSi_yTa_z$ nitride.

Furthermore, it is also possible for the dielectric used to be $HfO_2$, to which $SiO_2$ and/or $TiO_2$ are admixed. By way of example, the mixing ratios are set in such a manner that the proportion of the $SiO_2$ amounts to at most 90%, preferably at most 40%, and the proportion of the $TiO_2$ amounts to at least 5%.

Moreover, it is also possible for the dielectric used to be a mixed dielectric comprising at least one of the following materials: $HfTaO_x$, $HfAlO_x$, $TaTiO_x$, $AlTiO_x$, $ZrTaO_x$, $ZrTiO_x$, $ZrAlO_x$, $HfZrO_x$ and/or $ZrSiO_x$.

Yet another advantageous configuration of the method uses a metal oxide to which a lanthanide is admixed, as dielectric. The metal oxide used may, for example, be $HfO_2$, $Al_2O_3$, $TiO_2$, $ZrO_2$ or $Ta_2O_5$.

The electrode material selected is preferably a material that contains an element from the eighth transition group of the periodic system, for example ruthenium or iridium. It is also possible for HfN, TiN, NbN or TaN to be used as electrode material.

The two connection electrodes can be produced, for example, from the same material. By way of example, the two connection electrodes are each produced from TaN or TiN and the dielectric is produced from $HfTiO_x$. Alternatively, it is possible for the two connection electrodes also to be produced from ruthenium and the dielectric to be produced from $HfTiO_x$.

It is also possible to use different materials for the two connection electrodes. By way of example, one connection electrode is formed from TiN or TaN, and the other connection electrode is formed from ruthenium. In this case, the dielectric preferably consists of $HfTiO_x$, $HfSiO_x$ or $HfO_2$. By way of example, an inner electrode of the capacitor is produced from TiN and an upper (outer) electrode is produced from ruthenium, and $HfTiO_2$ is used as dielectric.

The capacitor can be fabricated in a recess in a silicon substrate or can be fabricated on the silicon substrate. By way of example, the capacitor can be designed as a trench capacitor or as a layer capacitor.

It is preferable to use the method described to fabricate DRAM memory modules having at least one capacitor with a feature size of less than 60 nm. The method can also be used to fabricate the gate dielectric of a field-effect transistor; the gate dielectric, the gate connection electrode and the associated substrate in this case, by way of example, form the capacitor mentioned.

BRIEF DESCRIPTION OF THE DRAWINGS

The invention is explained below on the basis of an exemplary embodiment. In the drawing.

The following list of reference symbols can be used in conjunction with the figures:

| 10 | Measured value curve |
| 20 | Measured value curve |
| 100 | Silicon substrate |
| 110 | Recess |
| 120 | Inner connection electrode |
| 130 | Dielectric |
| 140 | Outer connection electrode |
| 150 | Capacitor |

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention.

Figure 1:
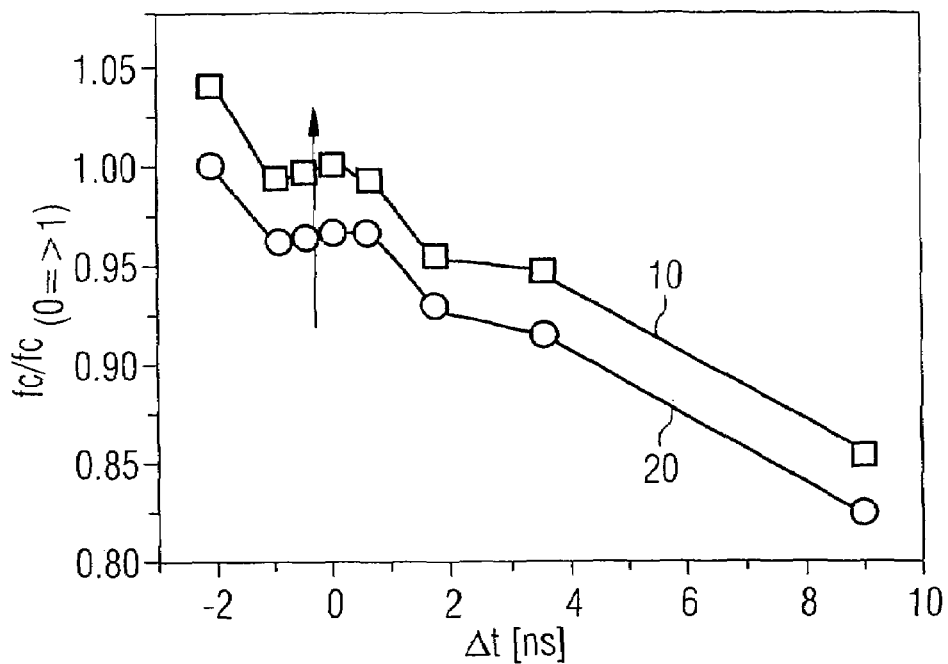
FIG. 1 shows a diagram that illustrates the storage behavior of a DRAM memory cell according to the prior art with an $Al_2O_3$ dielectric.

FIG. 1 shows two curves 10 and 20 that show the storage behavior of a DRAM memory cell with an $Al_2O_3$ dielectric. The curves in each case illustrate the read error rate fc at different read times: the point $\Delta t=0$ ns denotes the read error rate at a predetermined standard read time, while $\Delta t \neq 0$ gives the read error rate for shorter (t<0 ns) or longer (t>0 ns) read times. It can be seen that the read error rate fc decreases the more time is available for the read operation.

Curve 10 describes the read error rate for the case in which a logic "1" is stored in the memory cell and this logic "1" is read, with a logic "0" having been stored before the "1" which is to be read. Therefore, a bit change from "0" to "1"—represented in FIG. 1 by the numerical sequence "0=>1"—had taken place during the "storage history."

Curve 20 describes the read error rate for the situation in which a logic "1" is stored in the memory cell and this logic "1" is being read, with a logic "1" likewise already having been stored prior to the "1" that is now to be read. Therefore, no bit change—represented in FIG. 1 by the numerical sequence "1=>1"—had taken place in the "storage history."

It can be seen from the two curves 10 and 20 that the storage behavior of the memory cell is dependent on its prior history. Specifically, the storage behavior is approximately 5% worse, or the resulting read error rate is approx. 5% greater, if a logic "0" had been stored before a logic "1" than in the opposite scenario.

It should be noted that FIG. 1 illustrates the read error rate fc in normalized form. The normalization was based on the read error rate at the standard read time ($\Delta t=0$) for the case of reading a logic "1" when a logic "0" had been stored prior to the stored logic "1." The normalization standard value therefore relates to the situation "0=>1."

Figure 2:
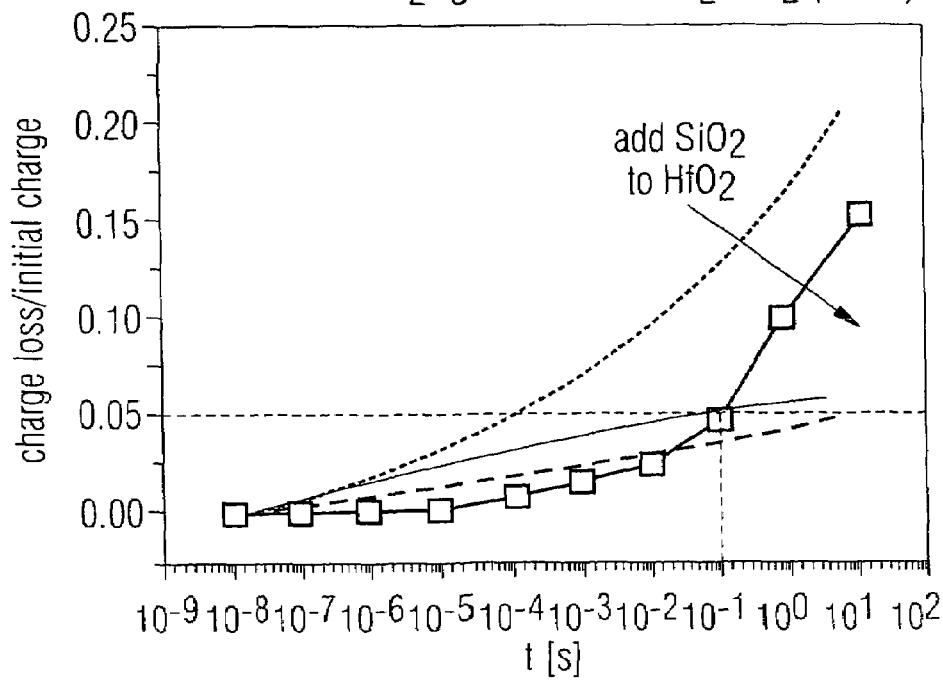
FIG. 2 shows a diagram illustrating the charge loss from a memory cell with a dielectric that has been improved in accordance with the invention compared to a memory cell with a dielectric according to the prior art.

FIG. 2 illustrates the loss of stored charge over the course of time. It can be seen that the loss of charge in the case of aluminum oxide ($Al_2O_3$) and oxinitride (NO) is less than 5% within a period of 0.1 second after the storing of the charge. This value is clearly marked in FIG. 2 for the sake of clarity.

By contrast, pure $HfO_2$ material has a significantly worse storage behavior, i.e., considerably greater storage losses, than aluminum oxide and oxinitride. It can be seen from FIG. 2 that the 5% limit is exceeded after just $10^{-4}$ seconds. However, a considerable improvement in the storage capacity of the $HfO_2$ dielectric can be achieved by admixing $SiO_2$ material in a ratio of 30:70 (70% $HfO_2/SiO_2$): by a storage time of $10^{-1}$ s, the storage behavior of an $HfO_2$ dielectric, which has been improved in this manner, on account of the admixed $SiO_2$, is similar to or even better than the storage behavior of an aluminum oxide or oxinitride.

It can, therefore, be established that by adding a further material—in this case the $SiO_2$—which disrupts the potential well distribution within the $HfO_2$ material, it is possible to considerably improve the storage behavior of the resulting dielectric.

Figure 3:
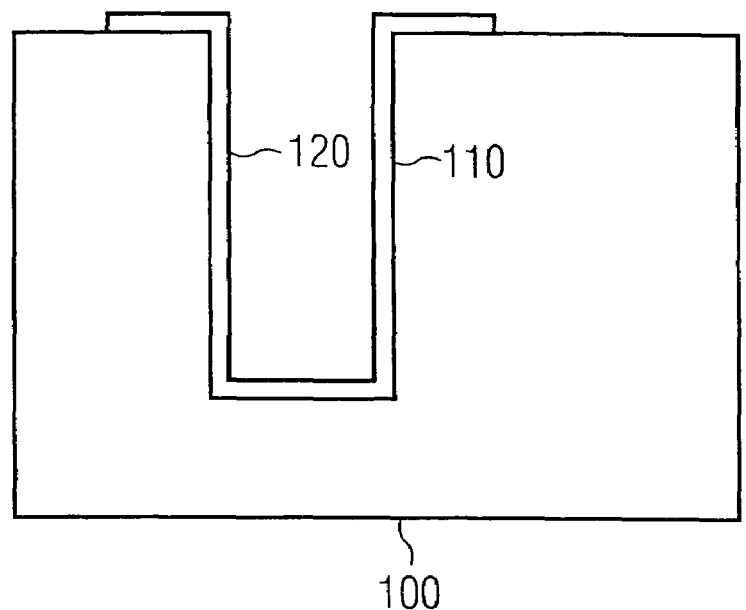
FIGS. 3 and 4 show illustrations of an exemplary embodiment of a method according to the invention for fabricating a DRAM memory cell according to the invention.
Figure 4:
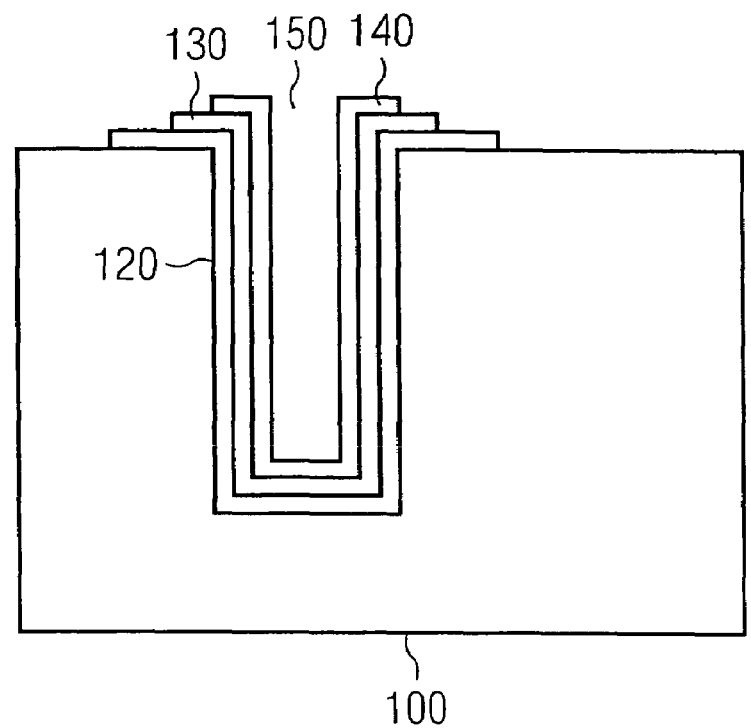

FIGS. 3 and 4 illustrate an exemplary embodiment of a method according to the invention for fabricating a capacitor. The figures show a silicon substrate 100, into which a recess 110 has been introduced, for example by etching. The recess 110 is first of all lined with an inner connection electrode 120, which preferably consists of TiN (FIG. 3).

A dielectric 130 of $HfTiO_2$ is deposited on the inner connection electrode 120. Then, an upper connection electrode 140 of ruthenium is applied to this dielectric 130.

The deposition of the dielectric 130 can be carried out, for example, by means of an ALD process, a CVD process or a PVD process, or alternatively using a mixed process combining the above-mentioned processes. If an ALD process is used, the pressure range is preferably between 100 mTorr to 10 Torr, and the temperature is preferably between 100° C. and 700° C.

Furthermore, the quality of the dielectric 130 can be improved during the deposition or after the deposition by means of plasma steps and/or heating steps. Any contamination of the dielectric can be expelled by an aftertreatment of this type, so as to improve the structural properties of the dielectric 130.

Examples of typical process gases for the deposition process for depositing the dielectric 130 include nitrogen and/or oxygen and/or $NH_3$ and/or NO and/or $N_2O$ and/or argon and/or hydrogen in temperature ranges between 400° C. and 1100° C. The plasma used in the deposition of the dielectric 130 may be "remote" (indirect, no voltage applied to the wafer) or "direct" (voltage applied to the wafer).

In the exemplary embodiment shown in FIGS. 3 and 4, the function of the outer Ru connection electrode 140 is to act as a getter for protons, which have accumulated in the dielectric 130 during deposition of the latter, in order to minimize transient polarization caused by protons and to increase the retention time of the resulting capacitor 150.

The function of the $TiO_2$ within the $HfTiO_2$ dielectric 130 is to disrupt the potential well distribution within the dielectric 130 and to reduce transient polarization effects caused by the dielectric.

Although the present invention and its advantages have been described in detail, it should be understood that various changes, substitutions and alterations can be made herein without departing from the spirit and scope of the invention as defined by the appended claims.

What is claimed is:

1. A method for fabricating an integrated circuit, the method comprising:
   forming a dielectric;
   adding within the dielectric a material, the material disrupting or at least reducing an equal distribution of potential wells within the dielectric; and
   forming at least one electrode in contact with the dielectric, wherein the dielectric and/or the at least one electrode are formed in such a manner that transient polarization effects are prevented or at least reduced.

2. The method as claimed in claim 1, wherein the at least one electrode comprises a material that acts as a getter for protons of the dielectric.

3. The method as claimed in claim 1, wherein the dielectric comprises a ternary, quaternary or higher material system comprising at least the following constituents:
   at least one oxide or nitride of a metal from the fourth transition group of the periodic system or at least one conductive oxide; and
   at least one element from the third or fourth main group or the fifth transition group of the periodic system.

4. The method as claimed in claim 3, wherein the dielectric comprises an Hf—Ti oxide, an Hf—Ti nitride, a Zr—Ti oxide or a Zr—Ti nitride with an admixture of aluminum or silicon.

5. The method as claimed in claim 4, wherein the dielectric comprises an $Hf_xAl_yTi_z$ oxide, an $Hf_xAl_yTi_z$ nitride, an $Hf_xSi_yTi_z$ oxide, an $Hf_xSi_yTi_z$ nitride, a $Zr_xAl_yTi_z$ oxide, a $Zr_xAl_yTi_z$ nitride, a $Zr_xSi_yTi_z$ oxide or a $Zr_xSi_yTi_z$ nitride.

6. The method as claimed in claim 3, wherein the dielectric comprises an Hf—Ta oxide, an Hf—Ta nitride, a Zr—Ta oxide or a Zr—Ta nitride with an admixture of aluminum or silicon.

7. The method as claimed in claim 6, wherein the dielectric comprises an $Hf_xAl_yTa_z$ oxide, an $Hf_xAl_yTa_z$ nitride, an $Hf_xSi_yTa_z$ oxide, an $Hf_xSiyTa_z$ nitride, a $Zr_xAl_yTa_z$ oxide, a $Zr_xAl_yTa_z$ nitride, a $Zr_xSi_yTa_z$ oxide or a $Zr_xSi_yTa_z$ nitride.

8. The method as claimed in claim 3, wherein the dielectric comprises $HfO_2$ with $SiO_2$ and $TiO_2$ admixed to it.

9. The method as claimed in claim 8, wherein mixing ratios are set in such a manner that the proportion of the $SiO_2$ amounts to at most 90%, and the proportion of the $TiO_2$ amounts to at least 5%.

10. The method as claimed in claim 3, wherein the dielectric comprises a mixed dielectric comprising at least one of the following materials: $HfTaO_x$, $HfAlO_x$, $TaTiO_x$, $AlTiO_x$, $ZrTaO_x$, $ZrAlO_x$, $HfZrO_x$, $ZrSiO_x$, $ZrTiAl$.

11. The method as claimed in claim 1, wherein the dielectric comprises $ZrTiO_x$.

12. The method as claimed in claim 1, wherein the dielectric comprises a metal oxide, and wherein a lanthanide is admixed to the metal oxide.

13. The method as claimed in claim 12, wherein the metal oxide comprises $HfO_2$, $Al_2O_3$, $TiO_2$, $ZrO_2$ or $Ta_2O_5$.

14. The method as claimed in claim 1, wherein at least one connection electrode is produced from a material that contains an element from the eighth transition group of the periodic system.

15. The method as claimed in claim 1, wherein at least one connection electrode is produced from a material that contains HfN, TiN, ruthenium, iridium, NbN or TaN.

16. The method as claimed in claim 1, wherein two connection electrodes are produced from the same material.

17. The method as claimed in claim 16, wherein the two connection electrodes are produced from TaN, and the dielectric is produced from $HfTiO_x$.

18. The method as claimed in claim 16, wherein the two connection electrodes are produced from TiN, and the dielectric is produced from $HfTiO_x$.

19. The method as claimed in claim 16, wherein the two connection electrodes are produced from ruthenium or iridium, and the dielectric is produced from $HfTiO_x$.

20. The method as claimed in claim 1, wherein two connection electrodes are produced from different materials.

21. The method as claimed in claim 20, wherein one connection electrode is formed from TiN and the other connection electrode is formed from ruthenium or iridium, and the dielectric is formed from $HfTiO_x$, $HfSiO_x$ or $HfO_2$.

22. The method as claimed in claim 20, wherein one connection electrode is formed from TaN and the other connection electrode is formed from ruthenium or iridium, and the dielectric is formed from $HfTiO_x$.

23. The method as claimed in claim 1 wherein forming the dielectric comprises forming a capacitor dielectric and wherein forming the at least one electrode comprises forming an inner connection electrode or an upper electrode, wherein the inner connection electrode is produced from TiN and the upper electrode is produced from ruthenium or iridium, and $HfTiO_2$ is used as the capacitor dielectric.

24. The method as claimed in claim 1, wherein a capacitor is formed in a recess that has been introduced into a silicon substrate, wherein forming the dielectric comprises forming a capacitor dielectric of the capacitor.

25. The method as claimed in claim 24, wherein the capacitor is formed as a stacked capacitor.

26. The method as claimed in claim 1, wherein forming the dielectric comprises forming a capacitor dielectric of a capacitor of a DRAM memory cell, the capacitor having a feature with a size of less than 60 nm.

27. The method as claimed in claim 1, wherein forming the dielectric comprises forming a gate dielectric of a field-effect transistor, and wherein forming the at least one electrode comprises forming a gate of the field-effect transistor.

28. A method for fabricating an integrated circuit, the method comprising:
forming a dielectric; and
forming at least one electrode in contact with the dielectric, wherein the dielectric comprises a mixed oxide or a mixed nitride comprising at least one element selected from the group consisting of zirconium and hafnium and one element selected from the group consisting of titanium and tantalum, wherein the dielectric further comprises silicon as an additive.

29. The method of claim 28, wherein the dielectric further comprises aluminum as an additive.

30. A method for fabricating an integrated circuit, the method comprising:
forming a dielectric; and
forming at least one electrode in contact with the dielectric, wherein the dielectric comprises a compound selected from the group consisting of $ZrAlO_x$, $HfZrO_x$, $ZrTiAl$, $ZrSiO_x$, and $HfO_2$, the dielectric further comprising an additive of $SiO_2$.

31. A method for fabricating an integrated circuit, the method comprising:
forming a dielectric; and
forming at least one electrode in contact with the dielectric, wherein the dielectric comprises $HfO_2$ comprising an additive of $SiO_2$ and/or $TiO_2$, and
wherein the at least one electrode comprises a metal selected from the group consisting of ruthenium and iridium.

32. The method as claimed in claim 30, wherein the dielectric comprises a compound selected from the group consisting of $ZrAlO_x$, $HfZrO_x$, $ZrTiAl$, $ZrSiO_x$, $AlTiO_x$ and $HfO_2$.

* * * * *